United States Patent
Vaassen et al.

(10) Patent No.: US 8,120,289 B2
(45) Date of Patent: Feb. 21, 2012

(54) OPTICAL ELECTRICAL SYSTEM IN PACKAGE FOR LED BASED LIGHTING SYSTEM

(75) Inventors: Steven F. E. Vaassen, Eindhoven (NL); Peter Deixler, Eindhoven (NL)

(73) Assignee: NXP B.V., Eindhoven (NL)

(*) Notice: Subject to any disclaimer, the term of this patent is extended or adjusted under 35 U.S.C. 154(b) by 248 days.

(21) Appl. No.: 12/517,264

(22) PCT Filed: Nov. 29, 2007

(86) PCT No.: PCT/IB2007/054845
§ 371 (c)(1),
(2), (4) Date: Jun. 2, 2009

(87) PCT Pub. No.: WO2008/068684
PCT Pub. Date: Jun. 12, 2008

(65) Prior Publication Data
US 2010/0060205 A1  Mar. 11, 2010

(30) Foreign Application Priority Data
Dec. 6, 2006 (EP) .................................. 06125541

(51) Int. Cl.
H05B 37/00 (2006.01)
H01L 21/50 (2006.01)

(52) U.S. Cl. ... 315/362; 315/320; 315/312; 257/E21.499
(58) Field of Classification Search .................. 315/320, 315/312, 210, 219; 345/102, 204, 40, 82; 257/E21.499; 438/23
See application file for complete search history.

(56) References Cited

U.S. PATENT DOCUMENTS

| | | | |
|---|---|---|---|
| 6,451,627 B1 | 9/2002 | Coffman | |
| 6,459,919 B1* | 10/2002 | Lys et al. | 600/407 |
| 7,102,172 B2* | 9/2006 | Lynch et al. | 257/79 |
| 7,425,943 B2* | 9/2008 | Furukawa | 345/102 |
| 7,508,141 B2* | 3/2009 | Wong | 315/185 S |
| 7,511,695 B2* | 3/2009 | Furukawa et al. | 345/102 |
| 7,538,497 B2* | 5/2009 | Furukawa | 315/291 |
| 2005/0153483 A1 | 7/2005 | Groenhuis et al. | |
| 2005/0231459 A1* | 10/2005 | Furukawa | 345/102 |
| 2006/0197474 A1* | 9/2006 | Olsen | 315/312 |
| 2007/0188427 A1* | 8/2007 | Lys et al. | 345/82 |

FOREIGN PATENT DOCUMENTS

| | | |
|---|---|---|
| EP | 1 589 519 A | 10/2005 |
| WO | 99/67821 A | 12/1999 |
| WO | 03/085728 A | 10/2003 |
| WO | 2006/056066 A | 6/2006 |

\* cited by examiner

Primary Examiner — Vibol Tan

(57) ABSTRACT

Packaged semiconductor electronic device to be individually positioned and coupled to peripheral electronic devices, the package comprising a light emitting semiconductor device, and a switch for controlling the light emitting semiconductor device.

11 Claims, 4 Drawing Sheets

OPTICAL ELECTRICAL SYSTEM IN PACKAGE FOR LED BASED LIGHTING SYSTEM

FIELD OF THE INVENTION

The present invention relates to an assembly of electronic devices, in particular to an assembly or a package including switches and light emitting semiconductor devices. The invention further relates to a system comprising the electronic device and the light emitting diodes, and a method of driving the diodes.

BACKGROUND OF THE INVENTION

Light emitting semiconductor devices are broadly used to enhance performance and power consumption characteristics of various applications. There are numerous applications and systems, where light emitting semiconductor devices are used as light sources. The present invention relates to all kinds of those applications. Just one example is Liquid Crystal Display (LCD) backlighting. In LCD backlighting systems a light source is needed to shine through the semi-transparent panel. Accordingly, backlighting supports the use of liquid crystal displays for a broad variety of applications, for which the liquid crystal displays were otherwise not suitable. A cost effective architecture for such a system requires multiple light emitting diodes (LEDs). Typically a matrix of light emitting diodes is provided behind a liquid crystal panel to provide sufficient and uniform light over the panel's whole area. The matrix or array of LEDs consists of strings of LEDs in one orientation. The number of single LEDs per string may be as high as 40 or more. The total string draws a small current, for example, 50 mA driven by a large voltage, for example 80 V, being applied across the complete string of LEDs. According to a most simple configuration, the so called 0 dimensional dimming (0 D dimming) is applied, wherein multiple strings connected in parallel are driven from a common off-the-shelf power supply. By adding a linear regulated current source to each string, the current per string can be adjusted. This results in the 1 dimensional dimming (1 D dimming). Further, if an individual control of the current through each LED within a string is desired, a bypass switch is added to each LED known as 2 dimensional dimming (2 D dimming). Further, the electrical properties of the LEDs and the switches may vary due to production spread and aging. Accordingly, from a system point of view, the organization and the arrangement as well as the control of the light emitting diodes and the switches challenges those skilled in art in seeking power efficient, reliable and cheap solutions. The above considerations are not limited to backlighting systems, but they relate to all kinds of lighting systems using light emitting semiconductor devices.

SUMMARY OF THE INVENTION

It is an object of the present invention to provide an electronic device and in particular a unit of electronic devices, as an assembly or a package of electronic devices including switches and light emitting semiconductor devices suitable to simplify production and control of light emitting semiconductor devices.

According to an aspect of the present invention an assembly, in particular a package of semiconductor electronic devices is provided, which is adapted to be individually positioned and coupled to peripheral electronic devices. The package (or assembly) includes a light emitting semiconductor device, e.g. a light emitting diode, and a switch for controlling the light emitting semiconductor device. The switch may be used as switch or as linear control means, for example as a control means for a current of the light emitting semiconductor device. This aspect of the present invention is based on the conclusion that preconfigured and assembled combinations of light emitting devices and switches as pairs provide particular advantages for production. Instead of providing e.g. LEDs and switches individually and arranging those devices during production on carriers, boards, or the like, this aspect of the present invention suggests to assemble at least one switch (e.g. a transistor) and one LED in a preconfigured unit. The advantage of such a package resides in a reduced need for interconnections between the switch and the LED, as those interconnections may already be provided before finally producing the end device including multiple LEDs. Further, also, the total number of connections is reduced as the switch and LED may be preconfigured in the assembly or the package. According to aspects of the present invention the pre-configuration may relate to connecting the switch and LED in series. According to another aspect of the invention the switch and the LED may be preconfigured such that the switch serves as a bypass switch. According to this configuration, the switch provides a current path bypassing the LED according to a 2-dimensional dimming as set out above.

According to an advantageous aspect of the present invention, the assembly or packaged semiconductor electronic device is arranged such that the electronic switch and the light emitting semiconductor device are positioned on a single carrier. In the context of the present invention a carrier is not restricted to the field of semiconductors, where the carrier may relate to a piece of metal, as for example a die or a wafer, on which the electronic components is integrated. According to the present invention, a carrier may be a small plate or a small board, for example, of copper or the like, on which multiple electronic devices are mounted. The substrate does not primarily provide a conductive connection between the devices, but basically holds the devices together to form a package. Therefore, the above aspect of the present invention relates to a reduced complexity of the manufacturing and assembling process of devices including a plurality of LEDs, as those LEDs are arranged in pairs of switches and LEDs on a single substrate. The carrier serves to provide mechanical stability, but it may also serve to carry electrical interconnectivity, if necessary.

Another aspect of the present invention provides for electrical decoupling of the switches. According to an aspect of the present invention, the packaged semiconductor electronic device (i.e. the assembly) includes a plurality of light emitting semiconductor devices and a plurality of switches, wherein each switch is electrically decoupled from another switch to prevent breakthrough. This aspect of the present invention accounts for a specific problem that may occur for large numbers of e.g. light emitting diodes and corresponding bypass switches being arranged in strings. If for example two diodes of different strings are arranged on a single semiconductor substrate, the voltage differences between the devices, in particular between the two switches of the diodes may be high enough to cause breakthrough. If, for example, the LEDs of a string of red LEDs are all switched off, while a parallel string of green LEDs is switched on, voltage differences of 80 V and more can occur between the devices. As a consequence, a break through between the integrated devices is possible that may destroy the device, if the diodes are located on the same semiconductor substrate. According to this aspect of the present invention, an electronic device is provided, wherein the voltage levels across e.g. bypass switches along the string of LEDs are at different levels. The switches operate at floating voltage levels depending on the instantaneous voltage along the LED strings. Accordingly, the maximum voltage difference across one switch and the current through the switch will only be in the range of the forward voltage and the current through one LED. The voltage amounts typically to e.g. 4 V and the currents through the diode e.g. typically to 50 mA. For voltage levels and currents of a few volts and several tens of mA, the conventional standard CMOS technologies are applicable. The above aspects of the present invention, in particular the provision to have only a single LED and a single switch in a package or a unit overcomes this problem. Accordingly, the voltage experienced by the devices of one package amounts only to the voltage drop of the individual package, even if the packages are arranged such that different LEDs in the same package belong to different strings. Generally, the large voltage differences are already prevented by providing the packaged semiconductor device as set out throughout this description.

Suitably, the switches of the present invention as discrete switches. Due to the large availability of discrete switches, particularly, transistors, switches with an optimized voltage behavior can be selected. More suitably, the switches are vertical transistors, which are in particular bipolar transistors. In this manner, the die pad onto which the switch is assembled, also acts as a contact. The die pad could be connected to the die pad of the LED, either by expansion of the die pad area, or through an interconnect. The latter option is particularly available in the UTLP package, which package will be explained in more detail below. The use of vertical transistors allows that at the top side of the transistor merely two contacts are present. A plurality of wires, or a clip, may be used at that top side, to allow an efficient provision of the input signal. This is suitable for high-voltage switches and power devices in particular.

Alternatively, the switches may be part of a larger integrated circuit, which is desired to cope with the required voltage.

According to another aspect of the present invention, the packaged semiconductor electronic device includes further a control unit for receiving commands for operating the switches, wherein the control unit is adapted to be coupled to a network, for example via a bus. This aspect relates to the problem of providing an effective and precise control mechanism for LEDs, in particular for LEDs of systems including large numbers of LEDs. Accordingly, the electronic device being included in an assembly or package is supplemented by a control unit. The control unit is adapted to provide a connection to a bus, such that control of the LEDs or a single LED and the corresponding switch is performed by commands (or data) transmitted over the bus. According to this aspect of the present invention, the control unit may particularly be configured to act as a switch controller bus interface being adapted to receive commands. The controller interface may be dedicated to turn the switch on and off. Further, the commands arriving over the bus may contain information relating to timing of the switching activity, the color, the luminance etc. of the LED, and the controller may be adapted to interpret these commands and translate them into appropriate signals to switch the switches on and off, accordingly. The control signals or bus commands, by which the interface unit in the electronic device is controlled, may contain pulse width modulated signal information for bypass switches in the electronic device.

According to an aspect of the present invention, the packaged semiconductor electronic device includes a non-volatile memory to store values for compensating characteristics of the light emitting semiconductor device. For this purpose, the electronic device according to the present invention may preferably include registers or memories, as for example one time programmable memories or other kinds of non-volatile memories. The calibration may not be limited to initialization of the electronic device, but may be carried out during the whole lifetime of the electronic devices, in particular during the lifetime of the light emitting diodes. Further, this aspect of the present invention relates to all kinds of characteristics of the light emitting devices.

According to still another aspect of the present invention, the packaged semiconductor electronic device includes a one time programmable (OTP) memory to store the time zero calibration values for compensating any deviating initial conditions or parameters of the components included in the electronic device. If multiple LEDs are coupled to form strings or arrays, or any other kind of interconnected plurality, each of the light emitting diodes may have different parameters, as for example wave length or intensity of the emitted light for a specific current. This is typically due to production spread of the LEDs. These variations may be compensated by calibration values being determined and stored in the electronic device according to the present invention.

According to an aspect of the present invention, the electronic device and in particular the control unit in the electronic device is adapted to determine the time, during which the light emitting semiconductor device was turned on. This parameter may preferably be used to calibrate the light emitting semiconductor devices with respect to aging effects, or to predict the estimated remaining lifetime of the device. Further, the electronic device may also include a sensor for measuring the light emitted by a diode. The measured values can be used for calibration of the LEDs. The calibration values may be stored in a memory as set out above.

According to still another aspect of the present invention, the packaging material is optically transparent. It should be mentioned that packaging according to the present invention does not generally imply that the electronic devices within the package are embedded entirely in a packaging material. In view of the main purpose of a light emitting semiconductor device, which is emitting light, the device is conventionally only partially enclosed by a package or packaging material. However, in order to protect the electronic device, and the components therein, an optically transparent material may be applied in areas, where light emission of the light emitting diodes is desired.

If an optically transparent version of a miniature package is used, such as HVQFN or UTLP package, an additional beneficial effect can be achieved that current loops between the controller, the switches and LEDs are minimized. This results in reduced electromagnetic interference and enables high-frequency, high performance switching. HVQFN packages are known per se, for instance from WO-A 99/67821. UTLP packages are packages based on a multi-layered carrier, which is patterned, for instance by etching, before and after provision of the encapsulation. One of the layers of the carrier is a continuous layer that ensures mechanical integrity of the carrier prior to provision of an encapsulation hereon. The continuous layer is patterned after the provision the encapsulation so as to isolate individual pads defined in the carrier.

Particularly, use is made of a Cu—Ni—Cu or Cu-Mb-Cu carrier with masks on both sides of the carrier. Said masks, for instance of NiAu, are used for patterning the Cu layers and simultaneously as solder adhesion layers. Such a package is for instance known from US2005/0153483 and U.S. Pat. No. 6,451,627. One benefit of the package is that pads and interconnects may be defined both in the first and the second Cu layer independently from each other. When an interconnect is defined in the first layer that at the inner side of the package, it need not to be exposed outside the package. Another benefit of the UTLP package, in comparison to the HVQFN package, is the absence of tie bars that are traditionally needed for mechanical integrity of the carrier (e.g. leadframe) prior to encapsulation. The absence of tie bars provides additional space, and it allows a much larger variety of shapes of pads and interconnects.

Further, according to still another aspect of the invention, the packaged semiconductor electronic device may be adapted to provide a signal for a beam shaping liquid crystal lens. Beam shaping lenses are typically used in applications with liquid crystal displays or the like. The light emitted by the light emitting diodes is passed through beam shaping lenses for the specific optical effects to be achieved by the display (e.g. smooth and uniform light). Accordingly, the packaged electronic device according to the present invention may be adapted to provide signals, for example by means of input and output pins, for other electronic devices. Alternatively, the transparent moulding compound of the packaged semiconductor electronic device may be given an adequate shape so as to fulfill the function of a lens.

According to an aspect of the present invention, a backlighting system is provided, which includes a plurality of light emitting diodes and a corresponding number of switches being arranged packages as described here above. The advantage of having preconfigured units, such as packages or assemblies of one or more light emitting diodes and one or more switches is particularly useful for backlighting systems. According to different aspects of the present invention, the package or assembly may include one pair of a switch and a LED, but also two pairs, three or even more pairs. A package of three light emitting diodes may especially be advantageous for white light or colored light. The packages may be arranged to form strings or the like.

According to still another aspect of the present invention, an electronic device is provided which includes a plurality of light emitting diodes and a switch for each of the light emitting diodes, wherein each pair of a switch and a light emitting diode is electrically decoupled from another pair of a switch and a light emitting diode to allow voltage differences between the switches without damaging the devices. This aspect of the invention relates to configurations, where multiple light emitting diodes are coupled in strings. The switches are preferably implemented in separate semiconductor substrates, which are mounted on a carrier.

According to different aspects of the invention, the switches may be arranged as bypass switches to provide a current path bypassing the light emitting diodes, or they may be arranged in series with the light emitting diodes. The assemblies or packages according to the present invention may be preconfigured to allow only one of these configurations, or each unit may be configurable to provide both options. The present invention is not limited to LEDs, but is beneficial to all light emitting semiconductor devices, as for example lasers, or the like. A package may preferably include three light emitting diodes of different colors as red, blue, and green, and three switches for each of the light emitting diodes. However, LEDs of other colors and of a different number may also be selected and combined in the electronic device, such as for example red, green, blue, amber (R, G, B, A) LEDs, warm white, cool white (WW/CW) LEDs, warm white, green, and blue (WW/G/B) LEDs. Further, the switches may be arranged as bypass switches for each of the LEDs, or they may be arranged in series.

BRIEF DESCRIPTION OF THE DRAWINGS

These and other aspects of the invention will be apparent from and elucidated with reference to the embodiments described hereinafter. The drawings are diagrammatical and not drawn to scale. The same reference numerals in different Figures refer to the corresponding elements. In the following drawings

DETAILED DESCRIPTION OF EMBODIMENTS

Figure 1:
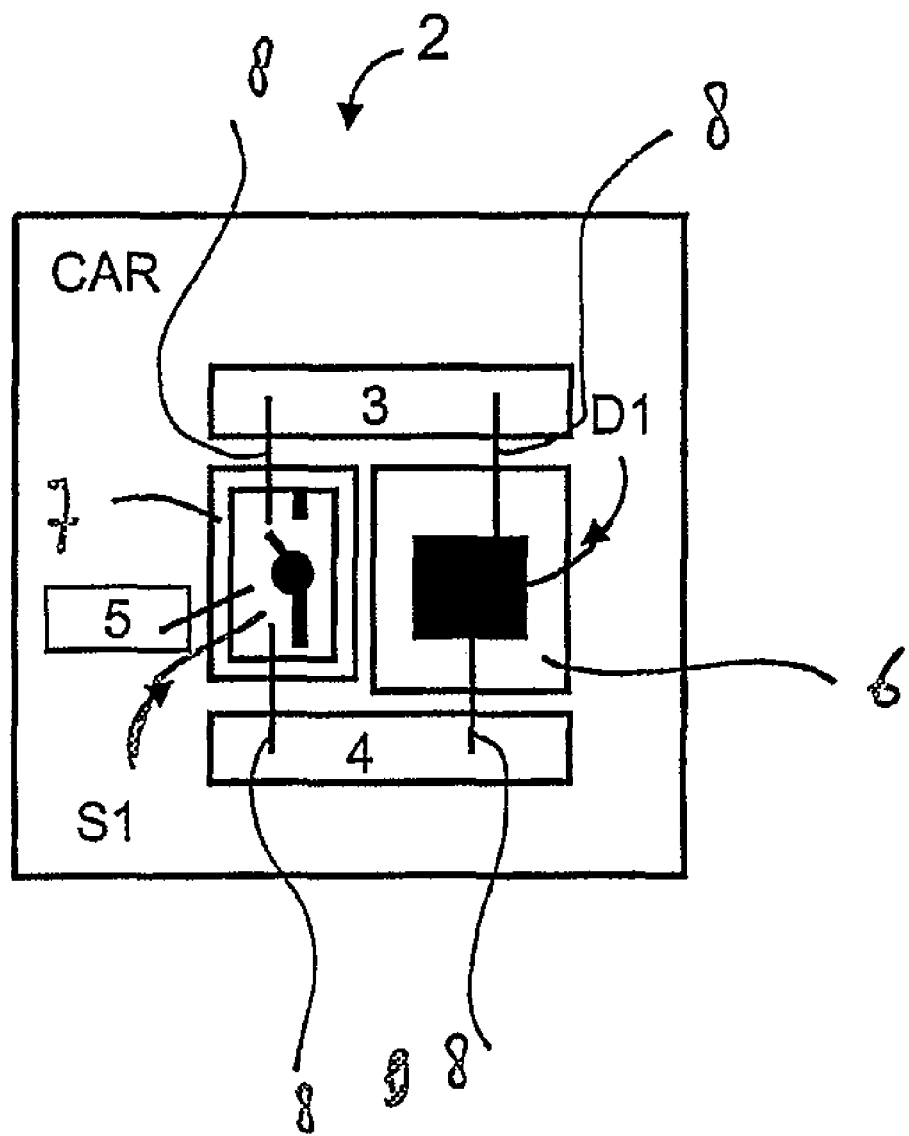
FIG. 1 shows a simplified representation of an embodiment according to first aspects of the present invention.
Figure 3:
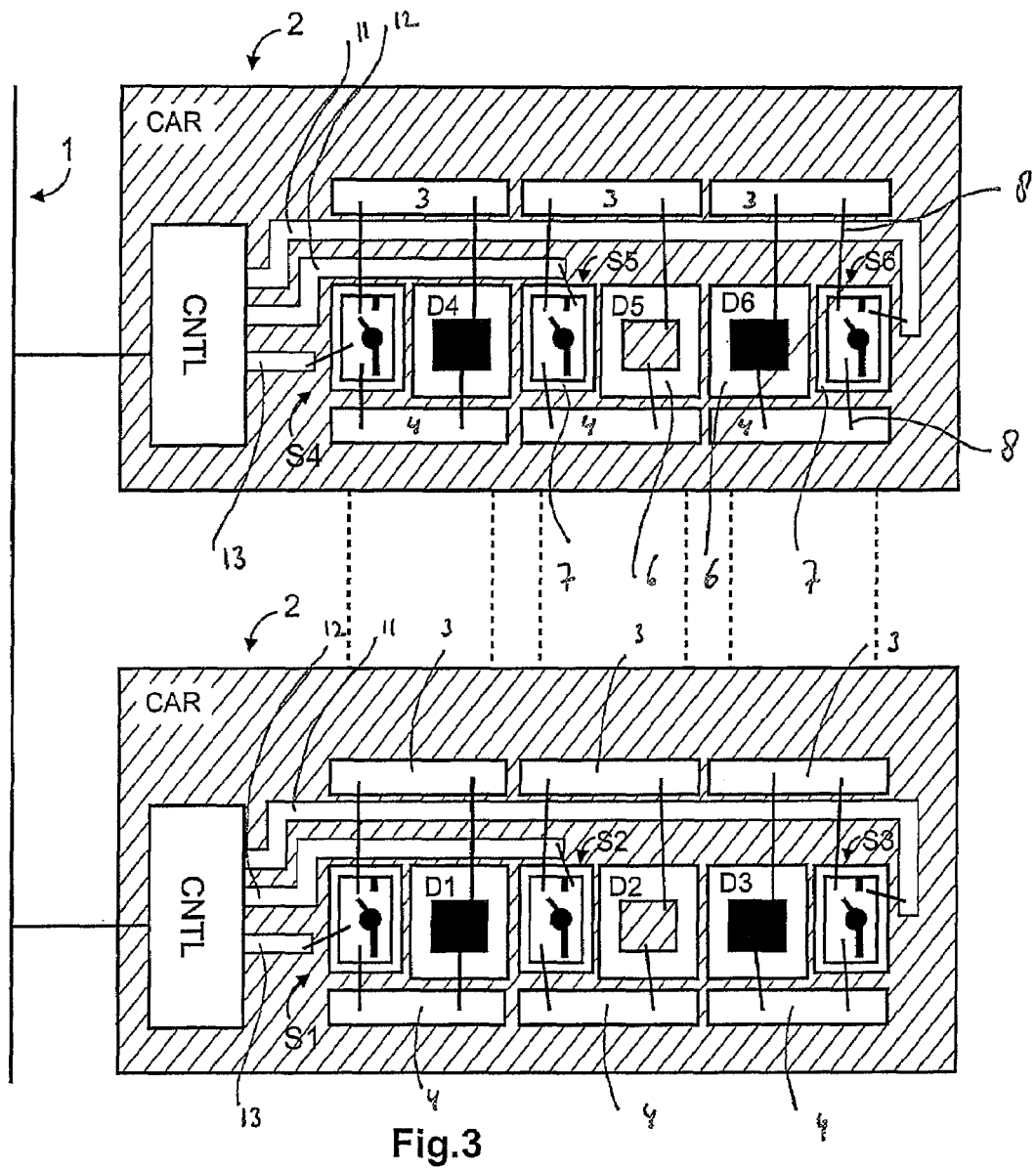
FIG. 3 shows a simplified representation of an embodiment according to third aspects of the present invention.
Figure 4:
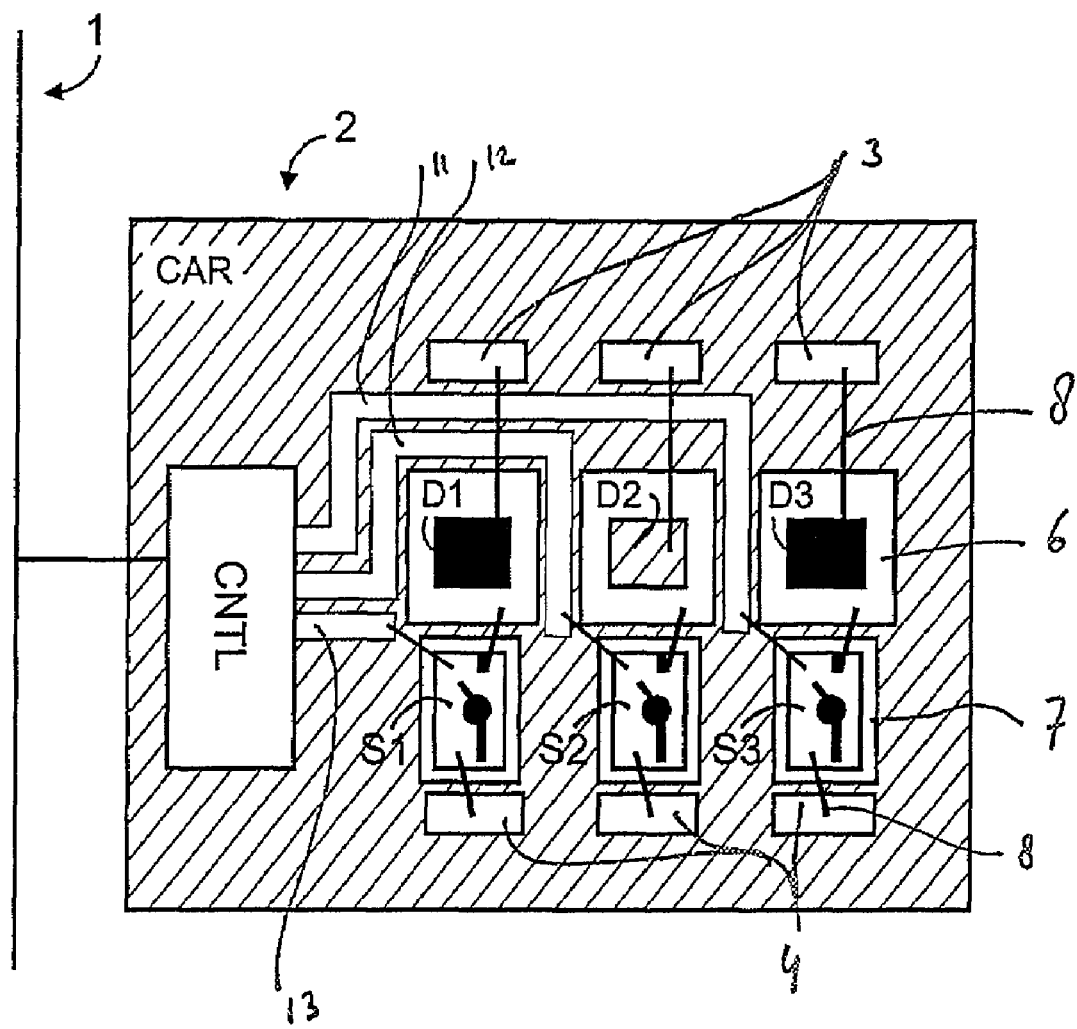
FIG. 4 shows a simplified representation of an embodiment according to forth aspects of the present invention.

FIG. 1 shows a simplified representation of an embodiment according to an aspect of the present invention. Accordingly, there is a carrier CAR, on which a switch S1 and a light emitting semiconductor device, e.g. a diode D1, are arranged. The light emitting diode D1 and the switch S1 are mounted on the carrier CAR to form together with the carrier CAR a unit as an assembly or a package. The carrier CAR shown in this FIG. 1 and the further FIGS. 3 and 4 is typically a UTLP or similar multilayer carrier or with a continuous layer. The continuous layer is to be patterned after provision of the encapsulation. This continuous layer is particularly a metal layer, such as a Cu-layer, and can be patterned through a masking layer. The patterning usually occurs by means of etching. Instead of patterned such continuous layer, the carrier may be patterned by removal of the continuous layer. However, this has turned out less attractive for the present kind of packages. One carrier CAR may contain the pads and the features for a plurality of individual packages, and may be provided with an encapsulation in a single step. The larger encapsulation is usually referred to as a moulding map. The individual packages are separation subsequently, for instance by means of sawing. The size of the carrier CAR shown is equal to the size of the final package. This size is however merely diagrammatically shown, and could easily be reduced with 20%.

The electrical paths—also referred to as contact pads—3, 4, 5 implement a pre-configuration of the switch as a bypass switch for the light emitting diode. The diode D1 and the switch S1 are provided on die pads 6,7. These die pads may be used for grounding and for heat sink purposes, as known to the skilled person. Wirebonds 8 provide the electrical connections between the devices D1 and S1. Instead of wirebonds, use may be made of clips. Alternatively, the switch and the devices may be assembled to the pads by flip chip, as known to the skilled person in the field of packaging. However, according to the present invention, also other configurations are possible, as a series of the diode D1 and the switch S1. The unit of an LED and a switch being mounted on the carrier CAR is adapted to be used for backlighting systems, where the package can easily be mounted on a larger carrier to form a matrix or an array of packages together with packages of the same type. As each of these packages according to the present invention is individually disposed on a larger carrier or board, the technology to be used for the switch and the diode can be a standard technology as a standard CMOS technology. Due to the specific configuration provided by the present invention, the voltage across the switch S1 and the LED D1 remains small enough to use low voltage or low power technologies for the electronic devices. The assembly shown in FIG. 1 may be arranged in a package. The package may be a standard package providing specific predefined pin configurations to ease automatic assembly. Further, the package may be an optically transparent version of a miniature package, such as HVQFN or UTLP. By using predefined packages the current loops between controller, switches and LEDs can be minimized, resulting in reduced electromagnetic interference. This aspect of the invention, provides reduced electromagnetic interference and supports high-frequency and high-performance switching.

Figure 2:
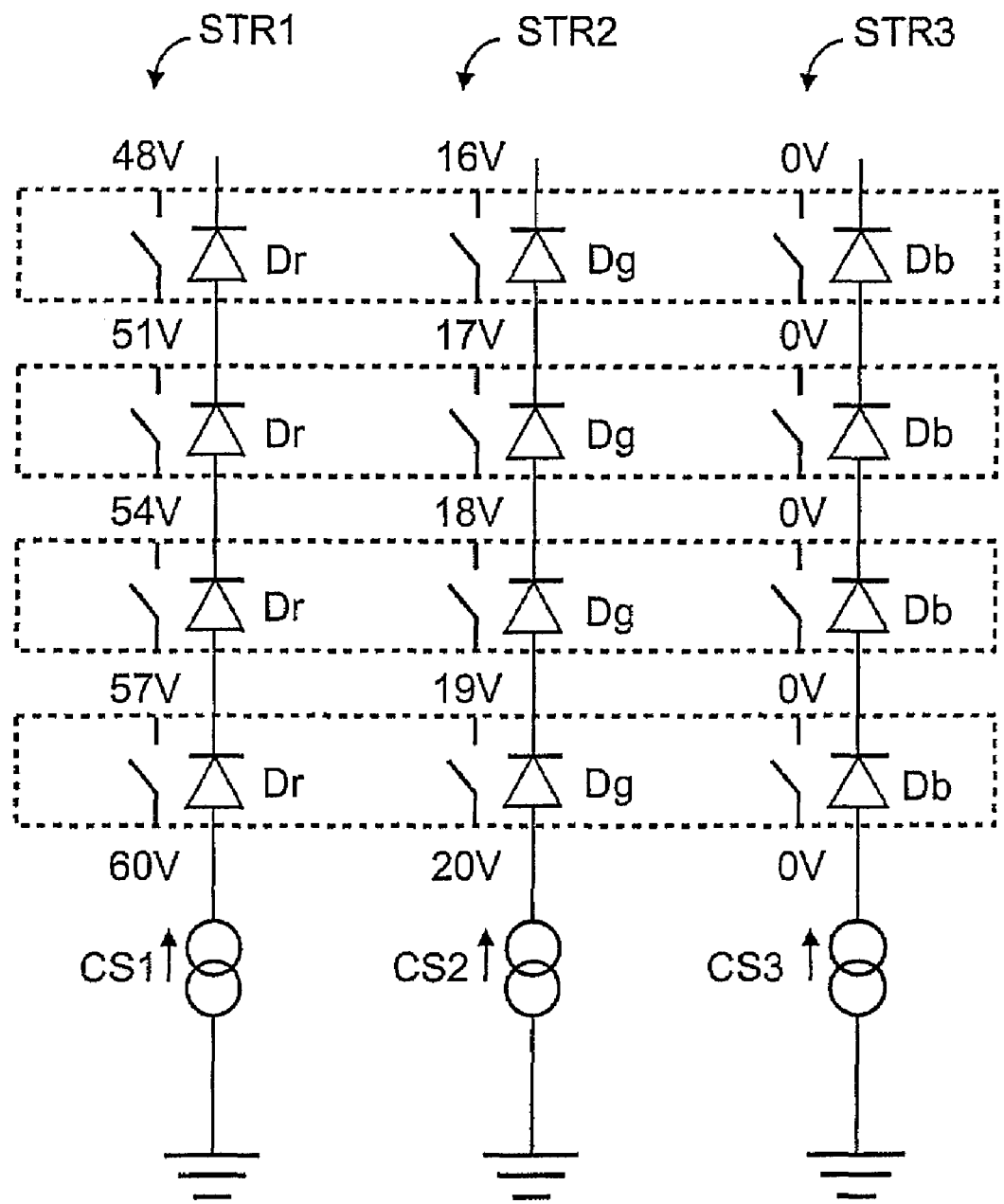
FIG. 2 shows a simplified representation of an embodiment according to second aspects of the present invention.

FIG. 2 shows an arrangement used to highlight an aspect of the present invention. Three serial strings STR1, STR2, STR3 of LEDs (Dr, Dg, Db) are coupled to three current sources CS1, CS2, and CS3. The combination of three LEDs in a package is used to provide a light source, which can emit white light. Each of the LEDs is accompanied by a bypass switch to allow individual control of the luminance of the LED. Depending on the actual driving conditions of the LED strings, the LEDs within one specific package can be at different voltage levels. If for example the red LEDs are switched off, i.e. they are at 0 V, and a green string is switched on, i.e. the voltage difference across the string is 80 V, there is a considerably high voltage difference between the individual switches of one package as depicted in FIG. 2. A cost effective architecture for such a system includes up to 40 or more LEDs connected in a serial string and drawing a small current as for example 50 mA. In order to drive those LEDs, a large voltage of for example 80 V is applied. As a consequence of the large voltage differences between the individual switches, breakdowns can occur, which may destroy the electronic device and thereby the functionality of the package. The present invention provides packages and assemblies which are suitable to avoid the above effect. Herein, the switches are electrically decoupled from each other in that they are present in different dies and on different pads, and the voltage difference between the switches remains in the range of the forward voltage of the LEDs. Further, as the voltage becomes small, low power and low voltage standard technologies may be used for manufacturing the electronic components. Consequently, the systems using the assemblies and packages according to the invention become cheaper.

In the Figure, individual units are indicated by dotted lines. While it is preferred that an individual unit is provided in a single package, it must be understood that a single package may also include two or three or even more units. This is particularly the case when a UTLP type package is used, in which no tie bars or other leads are present that need to be cut through in order to achieve that the pads are mutually electrically insulated.

FIG. 3 shows a representation of an embodiment according to an aspect of the present invention. Accordingly, there is a package that includes three LEDs D1, D2 and D3 and three switches S1, S2, S3. The three diodes may have different colors as red, blue and green for RGB color schemes or white light. The switches S1, S2, and S3 are arranged in an individual single piece of silicon, which are mounted on a carrier CAR having different die pads 6,7 and contact pads 3, 4, 5. The switches S1, S2, and S3 are arranged in parallel to the LEDs to provide current paths, which bypass the LEDs. This arrangement may be used for 2-dimensional dimming as explained above. The signals used to switch the devices are typically pulse width modulated signals (PWM). The bypass switches, each being on one discrete piece of silicon per LED, are physically separated to prevent breakdown as a result of the high voltage as explained with respect to FIG. 2. Accordingly, the diodes D1, D2, and D3 have the colors red, green, and blue. For each of the LEDs D1, D2, and D3, an individual separate bypass switch S1, S2, and S3 is provided. In this configuration, i.e. when different pieces of silicon for each LED are used, the switches along the string will be at different voltage levels. This requires that the switches operate at a floating voltage level that depends on the instantaneous voltage along the LED strings. Accordingly, the maximum voltage difference across and the current through one switch will only be as large as the forward voltage and the forward current of one LED. A typical example is 4 V and 50 mA. For these voltage and current levels, a standard cost efficient technology is available. Instead of simply providing direct connections to the switches S1, S2, and S3 and the LEDs, which is also an option according to the present invention, the package or assembly shown in FIG. 3 is provided with a control unit CNTL. This control unit can provide multiple different control functions.

According to a suitable embodiment of the present invention as multilayer carrier CAR is used that comprises a continuous layer, a plurality of pads and a first interconnect 11. This continuous layer ensures the mechanical integrity of the assembly prior to encapsulation and is patterned after encapsulation. As a result, the package is provided with exposed pads. Said pads may comprise a non-removed part of the continuous layer. The first interconnect is defined to provide at least a major portion of an electrical connection between the control unit CNTL and a switch. The first interconnect is suitably defined only on top of the continuous layer, and at a location of the continuous layer that will be removed after provision of the encapsulation. In this manner it is ensured that its bottom side (e.g. the one that is near to the continuous layer or even has an interface with the continuous layer) is at a larger distance from a board to which the package is to be provided than the exposed contact pads. Moreover, it will not be provided with a solder adhesion layer, when such a solder adhesion layer is used as a mask on the continuous layer. The latter is the case in the UTLP package. The first interconnect allows has a low resistance due to its presence in a good-conducting metal or alloy layer, usually a layer of Cu. This allows a fast provision of signals from the control unit to respective switch. The connection between the first interconnect and the switch could be made with one or more additional wirebonds. The connection between the control unit and the first interconnect is suitably also be achieved with wirebonding. However, use of a flip-chip technique for assembly of the control unit to the interconnect (and other pads) is not excluded. The first interconnect may be hidden in the package by the provision of a patterned insulating layer afterwards, for instance by means of screenprinting, at the location where the removed part of the continuous layer was present before removal. Evidently, it is suitable to provide a plurality of interconnects 11,12,13. The interconnect is particularly suitable in case that the distance between the switches is relatively large. This is however often the case with light emitting diodes, where one needs sufficient distance to obtain a desired optical effect.

According to one aspect, the control unit is primarily a bus interface to receive or transmit data for controlling the switches S1, S2, S3 and the LEDs. The control unit CNTL may further include a switch controller to receive commands for the switching operation of the switches S1, S2, and S3. According to one aspect of the present invention, the control unit includes one time programmable (OTP) memory. The memory can be used advantageously for calibration of the electronic device. As the LEDs may have varying wavelengths or intensity, due to production spread, the electronic device may compensate these variations by an initialization procedure. During such a procedure the LEDs D1, D2, D3 may be individually calibrated and the calibration values can be stored in the OTP. As an alternative, the memory may also be any other kind of non-volatile memory. The calibration procedure may be repeated during the whole lifetime of the LEDs to ensure constant parameters. This aspect of the invention takes account of aging of the LEDs. Further, the control unit may include means to determine the time during which the LEDs have been turned on. This allows to continuously observe the aging of the devices. In accordance with the measured ON-time, the LEDs may be calibrated, i.e. the switching sequences may be adapted or a signal may be provided that a device needs to be exchanged. A control unit CNTL having a functionality according to one or to all the above aspects may be included in a package of three pairs of switches and LEDs, a package having only one pair as shown in FIG. 1 or packages having two pairs or more than three. Also, larger numbers of LEDs and switches may be included in a package according to the present invention. According to a specific aspect of the present invention, multiple packages 2 are arranged to form arrays or strings of LEDs, being controlled by the bus 1. Accordingly, a second package 2 is indicated in FIG. 3 including switches S4, S5 and S6 and LEDs D4, D5, D6. The control unit CNTL of the second package is similar to the one of the first package. The control units CNTL may be configured to address each of the devices individually.

FIG. 4 shows a simplified representation of an embodiment according to an aspect of the present invention. Accordingly, there is a switch for each LED D1, D2, and D3 being in series with the respective LED. Accordingly, this package relates to a different pre-configuration and allows for example to switch off a complete string of LEDs. The control unit may be configured as set out with respect to FIG. 3.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Multiple LEDs or switches or other components may fulfill the functions of a single item recited in the claims or in the description as long as the functionality of the present invention is provided as described here above. The mere fact that certain measures are recited in mutually different dependent claims does not indicate that a combination of these measured cannot be used to advantage. Any reference signs in the claims should not be construed as limiting the scope.

The invention claimed is:

1. A packaged electronic device comprising:
a package configured and arranged to be individually positioned and coupled to peripheral electronic devices;
a light emitting semiconductor device deposed on the package, and
a switch, deposed on the package, for controlling the light emitting semiconductor device; and
a plurality of light emitting diodes and a plurality of switches, wherein each switch is disposed on a separate semiconductor substrate being electrically decoupled from a semiconductor substrate of another switch to allow large voltage differences between the switches without damaging the semiconductor device.

2. The packaged electronic device according to claim 1, further comprising further a control unit for receiving commands for operating the switches, and an interface to be coupled to a network.

3. The packaged electronic device according to claim 2, further comprising further a non-volatile memory to store values for compensating characteristics of the light emitting semiconductor device.

4. The packaged electronic device according to claim 3, wherein the non-volatile memory is an OTP memory to store time zero calibration values to compensate for initial differences in wave length or intensity of emitted light from the light emitting semiconductor device.

5. The packaged electronic device according to claim 4, wherein packaging material is optically transparent, wherein the package is a HVQFN or UTLP package to minimize current loops between a switch controller and a bus interfaces, the switches, and the light emitting semiconductor devices.

6. The packaged electronic device according to claim 1, wherein an integrated circuit arranged in a low power package is used to supply a voltage to a beam shaping liquid crystal (LC) lens.

7. An electronic device comprising:
a plurality of light emitting semiconductor devices,
switches for each of the light emitting semiconductor devices, wherein
each-switch and light emitting semiconductor device pair are electrically decoupled from another switch and light emitting semiconductor device pair to allow large voltage differences between the switches without damaging the electronic device.

8. The electronic device according to claim 7, wherein, the switches are arranged as bypass switches to provide a current path bypassing the light emitting semiconductor device.

9. The electronic device according to claim 7, wherein the switches are arranged in series with the light emitting semiconductor device.

10. The electronic device according to claim 7, comprising three pairs of light emitting diodes and switches, wherein the switches are implemented on one separate individual semiconductor substrate and three semiconductor devices are light emitting diodes of the colors red, blue, and green.

11. A method of manufacturing a packaged electronic device, comprising the steps of:
providing a carrier comprising a plurality of pads;
assembling a switch and a light emitting semiconductor device to the at least one pad of the carrier and electrically coupling the switch and the light emitting semiconductor devices to contact pads;
providing an encapsulation;
patterning the carrier so as to mutually electrically isolate individual pads.

* * * * *